United States Patent
Flannagan

[19]

[11] Patent Number: 6,031,408
[45] Date of Patent: Feb. 29, 2000

[54] SQUARE-LAW CLAMPING CIRCUIT

[75] Inventor: Stephen Flannagan, Austin, Tex.

[73] Assignee: Motorola, Inc., Schaumburg, Ill.

[21] Appl. No.: 08/076,080

[22] Filed: Jun. 14, 1993

Related U.S. Application Data

[62] Division of application No. 07/951,620, Sep. 28, 1992, Pat. No. 5,293,081, which is a division of application No. 07/763,018, Sep. 20, 1991, Pat. No. 5,184,033.

[51] Int. Cl.[7] .............................. G06F 7/552; G06F 7/556
[52] U.S. Cl. ........................ 327/349; 327/313; 327/327; 327/328; 327/543; 327/350
[58] Field of Search .................................. 307/492, 503, 307/540, 552, 554, 555, 557, 560, 567, 568; 328/144; 327/349, 350, 582, 309, 313, 314, 320, 325, 327, 328, 315, 316, 318, 538, 543

[56] References Cited

U.S. PATENT DOCUMENTS

| | | | |
|---|---|---|---|
| 3,813,595 | 5/1974 | Sheng | 323/4 |
| 4,314,167 | 2/1982 | Groves et al. | 307/540 |
| 4,375,038 | 2/1983 | Crosby | 307/492 |
| 4,453,091 | 6/1984 | Katakura et al. | 307/350 |
| 4,507,577 | 3/1985 | Kwan | 307/494 |
| 4,524,292 | 6/1985 | Nagano | 307/494 |
| 4,855,618 | 8/1989 | Brokaw | 307/310 |
| 4,914,316 | 4/1990 | Rossi et al. | 307/246 |
| 5,029,281 | 7/1991 | Armstrong | 307/555 |
| 5,177,374 | 1/1993 | Carpenter et al. | 307/270 |
| 5,187,396 | 2/1993 | Armstrong, II et al. | 307/494 |

FOREIGN PATENT DOCUMENTS

| | | | |
|---|---|---|---|
| 0168321 | 10/1983 | Japan | 307/567 |
| 2034996 | 4/1980 | United Kingdom | 307/568 |

*Primary Examiner*—Terry D. Cunningham
*Attorney, Agent, or Firm*—Paul J. Polansky

[57] ABSTRACT

A square-law clamping circuit (99, 120) sinks a current from an input/output terminal proportional to a square of a difference between a voltage thereon and a reference voltage. A first MOS transistor (130) has a source for receiving the reference voltage, a gate, and a drain coupled to its gate. A current source (134) coupled to the drain of the first MOS transistor (130) sources a predetermined current therefrom. A second MOS transistor (132) has a source providing the input/output terminal (100, 121), a gate coupled to the drain of the first MOS transistor (130), and a drain. A current sink (135) coupled to the drain of the second MOS transistor (132) sinks a current therefrom.

7 Claims, 4 Drawing Sheets

SQUARE-LAW CLAMPING CIRCUIT

This is a division of application Ser. No. 07/951,620 filed on Sep. 28, 1992, now U.S. Pat. No. 5,293,081, which is a division of application Ser. No. 07/763,018, now U.S. Pat. No. 5,184,033, filed Sep. 20, 1991.

FIELD OF THE INVENTION

This invention relates generally to electrical circuits, and more particularly, to clamping circuits.

BACKGROUND OF THE INVENTION

In integrated circuits, there is generally a piece of silicon known as a die or chip which contains electrical circuits. The chip has bonding pads which are used as interconnection points to other circuitry. For example, the chip may be connected to a lead frame by tiny wires. The lead frame in turn has leads which are used for connecting to a printed circuit board as part of a larger system. The leads of the lead frame have a certain amount of inductance as well as capacitance and resistance. There is also some inductance in the wire connecting the bonding pad to the lead frame. The wire inductance, however, is significantly less than that of the lead frame. The connection of a lead of the lead frame to a circuit board also adds some inductance. As the switching speeds of integrated circuits have increased, this cumulative inductance has begun to have an impact on the performance of the integrated circuit.

Of course it is desirable to have integrated circuits which are very fast. The increased switching speed has also increased the rate at which current changes. This increased rate of current change causes a voltage drop across the inductance. The voltage across an inductance is equal to the inductance times the time rate of change of the current through that inductance. This is expressed as Ldi/dt, where L is the inductance and di/dt is the time rate of change of the current. As the di/dt becomes larger, the voltage across the inductance becomes larger. This voltage drop across an inductance causes a voltage differential between the lead location on the circuit board and the bonding pad to which it is connected on the integrated circuit. This can create a problem of having the internal supply at a different voltage than the voltage of the external supply. This problem can cause the internal supply voltages to differ by so much from their external levels that signals input to the chip are recognized incorrectly.

Several known output buffer circuits provide di/dt control along with fast speed. In recent years, integrated circuit fabrication techniques have provided the ability to manufacture both MOS transistors and bipolar transistors on a single integrated circuit. The use of bipolar transistors improves the speed of output buffers because bipolar transistors generally switch faster than MOS transistors. However, the use of bipolar transistors creates additional problems. One problem is that the increased rate of switching of output buffers with bipolar transistors has worsened the di/dt problem. New circuits are required to take advantage of the improved switching speed of bipolar transistors while maintaining acceptable levels for di/dt.

A second problem results from the fact that bipolar transistors degrade in the reverse biased condition and as reverse bias increases, the amount of degradation increases. Therefore using bipolar transistors with a large reverse bias is subject to reliability problems in that the transistors may degrade over time, ultimately resulting in a failure of the entire integrated circuit.

A third problem arises from the nature of a bipolar transistor itself. In the bipolar transistor, a junction capacitance exists between the P and N areas of silicon. The junction capacitance arises from the minority charge-storing capacity of a PN junction. For example, an NPN transistor has a base-emitter capacitance at the PN base-emitter junction. Minority (N-type) carriers are stored in the P-type base near the junction, and minority (P-type) carriers are stored in the N-type emitter near the junction. The capacitance, sometimes referred to as the diffusion capacitance, represents the ability of the P-type base and the N-type emitter to store minority charge near the junction. The capacitance is determined in part by the bias on the PN junction, and as the forward bias increases, the capacitance also increases.

In some circumstances, the base-emitter capacitance can be significant enough to affect circuit performance. In a circuit using a bipolar transistor as an emitter follower, the base-emitter capacitance can affect the output voltage on the emitter after the base voltage changes. In the emitter-follower configuration, when the voltage on the base increases, the voltage on the emitter follows, rising by the same amount. The expected voltage on the emitter is equal to the voltage on the base, minus one base-to-emitter diode voltage drop ($V_{BE}$). However under certain circumstances, the voltage on the base may be self-boosted by the effect of the base-emitter capacitance. When the voltage applied to the base rises quickly, and the load connected to the emitter is highly capacitive, a large base-to-emitter voltage can develop. Then as the voltage on the emitter rises, a bootstrap effect increases the base voltage due to the base-emitter capacitance. If the loading is sufficiently capacitive, then the voltage on the base rises beyond the voltage applied. Eventually, the voltage on the emitter follows the voltage on the base minus $V_{BE}$. If there is no path to discharge the base-emitter capacitor, the voltage on the emitter remains above the desired voltage level. For some circuit applications, such as output buffers, the possibility that the output voltage will self-boost beyond the desired value is harmful to operation of the circuit.

A fourth problem is that output buffers must be able to operate well under a variety of load conditions. With improved technology, many integrated circuits now are able to operate at less than the standard 5-volt power supply voltage, such as at a power supply voltage of 3.3 volts. This increases the number of possible load types which the output buffer must drive. The loads can be generally characterized as being one of four types. In one type, the output buffer drives a signal through a transmission line which terminates at an integrated circuit having a 5-volt power supply. If the output signal provided by the output buffer exceeds 5 volts plus one diode drop, then the voltage across a diode on the integrated circuit exceeds its cutin voltage and the signal is clamped to 5 volts plus one diode drop. A second type is modeled as a transmission line terminating in an integrated circuit with a lower power supply voltage, such as 3.3 volts. A diode clamps the output signal to 3.3 volts plus one diode drop. A third type is a standard TTL load having a resistance of approximately 480 ohms between the signal line and a 5-volt power supply voltage terminal, a resistance of approximately 255 ohms between the signal line and the ground power supply voltage terminal, and a capacitance of approximately 30 picofarads (pF) to ground. A fourth type is an open circuit. Thus, an expanding range of possible load types to which the output buffer may be connected requires new approaches.

SUMMARY OF THE INVENTION

Accordingly, there is provided, in one form, a square-law clamping circuit is provided comprising an input/output terminal, an output terminal, first and second MOS transistors, current means, and current mirror means. The first MOS transistor has a source for receiving a reference voltage, a gate, and a drain coupled to the gate of the first MOS transistor. The current means is coupled to the drain of the first MOS transistor, and provides a predetermined current therefrom. The second MOS transistor has a source providing the input/output terminal, a gate coupled to the drain of the first MOS transistor, and a drain. The current mirror means is coupled to the drain of the second MOS transistor and to the output terminal, and mirrors a current flowing from the drain of the second MOS transistor to the output terminal.

These and other features and advantages will be more clearly understood from the following detailed description taken in conjunction with the accompanying drawings.

DETAILED DESCRIPTION OF THE INVENTION

Figure 1:
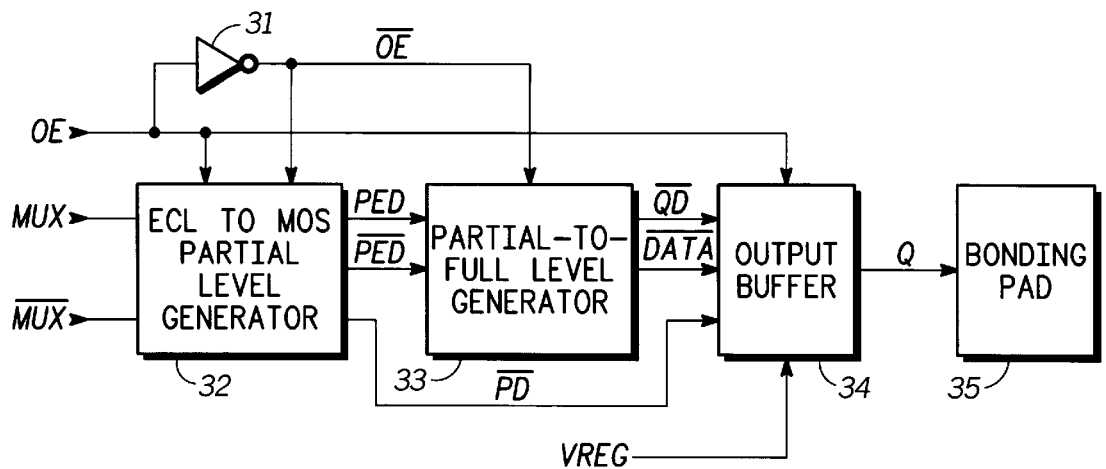
FIG. 1 illustrates in block form a portion of an integrated circuit including an output buffer in accordance with the present invention.

FIG. 1 illustrates in block form a portion of an integrated circuit 30 including an output buffer 34 in accordance with the present invention. Portion 30 includes an inverter 31, an ECL-to-MOS partial level generator 32, a partial-to-full level generator 33, output buffer 34, and a bonding pad 35. The function of each of the blocks of portion 30 will be more clearly understood in connection with the following description with regard to FIGS. 2–6. However, FIG. 1 is helpful in understand the overall operation of output buffer 34.

A signal labelled "Q" is provided by output buffer 34 in response to an output enable signal, labelled "OE". Signal OE is provided to generator 32 and output buffer 34. However for more convenient use inverter 31 inverts signal OE to provide its complement, labelled "$\overline{OE}$", which is provided to generator 32 and generator 33. Generator 32 receives a digital signal represented as a differential voltage between signals labelled "MUX" and "$\overline{MUX}$". In the illustrated embodiment, MUX and $\overline{MUX}$ form an ECL-level differential signal pair. Generator 32 provides a partial-level true signal labelled "PED", and partial-level complement signals labelled "$\overline{PED}$" and "$\overline{PD}$", in response to the logic state represented by MUX and $\overline{MUX}$, when enabled by signal OE being active. Signals PED and $\overline{PED}$ have been reduced from ECL signal levels by one diode voltage drop, but lack the voltage swing of CMOS signals. However, generator 33 provides two active-low signals, labelled "$\overline{QD}$" and "$\overline{DATA}$", in response to partial-level signals PED and $\overline{PED}$. Signal $\overline{QD}$ is a full-CMOS level signal, whereas signal $\overline{DATA}$ has a logic high level of one $V_{BE}$ below $V_{DD}$. Output buffer 34 in turn receives signals $\overline{QD}$ and $\overline{DATA}$ and partial level signal $\overline{PD}$ to provide signal Q to bonding pad 35 when enabled by signal OE being active. When disabled by signal OE being inactive, output buffer 34 provides signal Q in a high-impedance state.

Output buffer 34 also receives a reference voltage for use in a voltage regulator of output buffer 34 labelled "VREG". VREG is a predetermined reference voltage generated on-chip by a circuit such as a bandgap reference voltage generator, and is chosen to alter the performance of output buffer 34 to meet the requirements of all possible load types. However, in other embodiments VREG may be received as an input to the integrated circuit. It should be noted that portion 30 illustrates an output buffer of a static random access memory (SRAM). In such a device, generators 32 and 33 together are conventionally referred to as a final amplifier. Signals MUX and $\overline{MUX}$ are signals which represent the contents of a memory cell accessed by row and column decoding. However it should be apparent that portion 30 may be adapted for other integrated circuits and input signal types.

Figure 2:
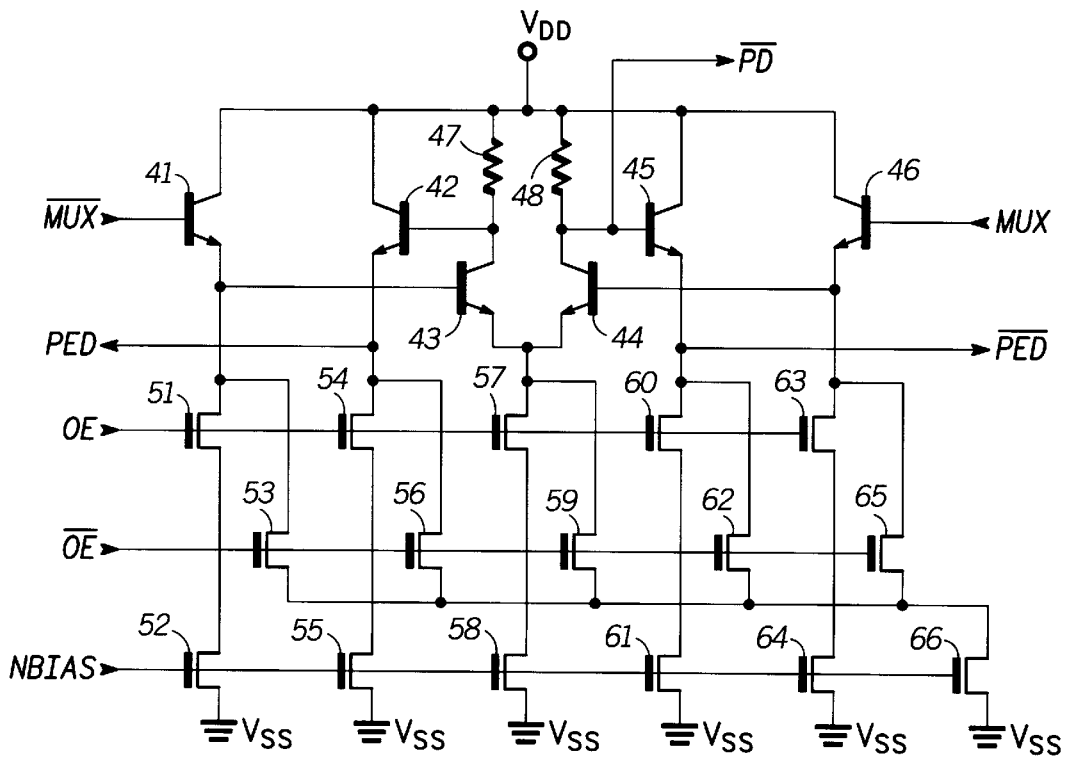
FIG. 2 illustrates in schematic form the ECL-to-MOS partial level generator of FIG. 1.

FIG. 2 illustrates in schematic form ECL-to-MOS partial level generator 32 of FIG. 1. Generator 32 includes NPN transistors 41–46, resistors 47 and 48, and N-channel MOS transistors 51–66. Transistor 41 has a collector connected to a positive power supply voltage terminal labelled "$V_{DD}$", a base for receiving signal $\overline{MUX}$, and an emitter. Transistor 42 has a collector connected to $V_{DD}$, a base, and an emitter for providing signal PED. Transistor 43 has a collector connected to the base of transistor 42, a base connected to the emitter of transistor 41, and an emitter. Transistor 44 has a collector for providing signal $\overline{PD}$, a base, and an emitter connected to the emitter of transistor 43. Transistor 45 has a collector connected to $V_{DD}$, a base connected to the collector of transistor 44, and an emitter for providing signal $\overline{PED}$. Transistor 46 has a collector connected to $V_{DD}$, a base for receiving signal MUX, and an emitter connected to the base of transistor 44. Resistor 47 has a first terminal connected to $V_{DD}$, and a second terminal connected to the collector of transistor 43. Resistor 48 has a first terminal connected to $V_{DD}$, and a second terminal connected to the collector of transistor 44.

Transistor 51 has a drain connected to the emitter of transistor 41, a gate for receiving signal OE, and a source. Transistor 52 has a drain connected to the source of transistor 51, a gate for receiving a bias signal labelled "NBIAS", and a source connected to a negative power supply voltage terminal labelled "$V_{SS}$". Transistor 53 has a drain connected to the emitter of transistor 41, a gate for receiving signal $\overline{OE}$, and a source. Transistor 54 has a drain connected to the emitter of transistor 42, a gate for receiving signal OE, and a source. Transistor 55 has a drain connected to the source of transistor 54, a gate for receiving signal NBIAS, and a source connected to $V_{SS}$. Transistor 56 has a drain connected to the emitter of transistor 42, a gate for receiving signal $\overline{OE}$, and a source connected to the source of transistor 53. Transistor 57 has a drain connected to the emitters of transistors 43 and 44, a gate for receiving signal OE, and a source. Transistor 58 has a drain connected to the source of transistor 57, a gate for receiving signal NBIAS, and a source connected to $V_{SS}$. Transistor 59 has a drain connected to the emitters of transistors 43 and 44, a gate for receiving signal $\overline{OE}$, and a source connected to the sources of transistors 53 and 56. Transistor 60 has a drain connected to the emitter of transistor 45, a gate for receiving signal OE, and a source. Transistor 61 has a drain connected to the source of transistor 60, a gate for receiving signal NBIAS, and a source connected to $V_{SS}$. Transistor 62 has a drain connected to the emitter of transistor 45, a gate for receiving signal $\overline{OE}$, and a source connected to the sources of transistors 53, 56, and 59. Transistor 63 has a drain connected to the emitter of transistor 46, a gate for receiving signal OE, and a source. Transistor 64 has a drain connected to the source of transistor 63, a gate for receiving signal NBIAS, and a source connected to $V_{SS}$. Transistor 65 has a drain connected to the emitter of transistor 46, a gate for receiving signal $\overline{OE}$, and a source connected to the sources of transistors 53, 56, 59, and 62. Transistor 66 has a drain connected to the sources of transistors 53, 56, 59, 62, and 65, a gate for receiving signal NBIAS, and a source connected to $V_{SS}$.

Generator 32 is a BICMOS, ECL to partial-CMOS level generator. Signals MUX and $\overline{MUX}$ are differential ECL-level signals. When OE is inactive, transistors 51, 54, 57, 60, and 63 are all nonconductive, preventing current normally provided by current sources formed by transistors 52, 55, 58, 61, and 64, from flowing. However, transistors 53, 56, 59, 62, and 65 are conductive, and a smaller current provided by a current source formed by transistor 66 causes the voltage at the emitters of transistors 41–46 to follow the voltage of either signal MUX or signal $\overline{MUX}$, as the case may be, less one $V_{BE}$ drop. When OE is active, generator 32 provides signals PED, $\overline{PED}$, and $\overline{PD}$ in response to MUX and $\overline{MUX}$. Transistors 41 and 46 each provide a single diode voltage drop, labelled $V_{BE}$, from ECL-level signals MUX and $\overline{MUX}$. (Here and in the following discussion, $V_{BE}$ generically refers to such a voltage drop; it will be apparent to those skilled in the art that the precise value of $V_{BE}$ will vary between transistors, which in general have different characteristics which affect $V_{BE}$ such as emitter area.) These level-shifted signals are provided as inputs to a differential-stage formed of resistors 47 and 48, transistors 43, 44, and a current source formed by transistor 58. The output signals of this differential stage, at the second terminals of resistors 47 and 48, have a logic high voltage of $V_{DD}$, and a logic low voltage of either $(V_{DD}-I_{58}R_{47})$ or $(V_{DD}-I_{58}R_{48})$, where $I_{58}$ is the current provided by transistor 58 when biased by NBIAS, $R_{47}$ is the resistance of resistor 47, and $R_{48}$ is the resistance of resistor 48. Signal $\overline{PD}$, at the second terminal of resistor 48, is provided as a partial-level signal to output buffer 34. Signals PED and $\overline{PED}$, however, are level-shifted further by one diode voltage drop by transistors 42 and 45, respectively, and thus have a logic high voltage of approximately $(V_{DD}-V_{BE})$, and a logic low voltage of either approximately $(V_{DD}-I_{58}R_{47}-V_{BE})$ or approximately $(V_{DD}-I_{58}R_{48}-V_{BE})$.

Figure 3:
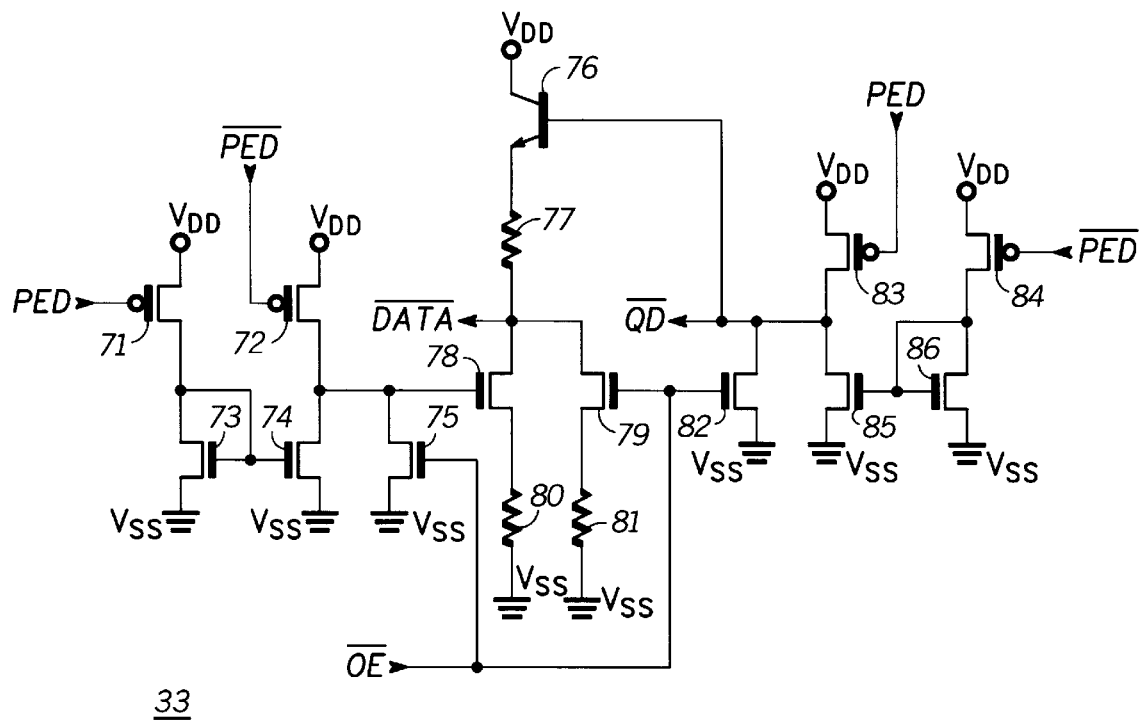
FIG. 3 illustrates in schematic form the partial-to-full level generator of FIG. 1 in accordance with the present invention.
Figure 7:
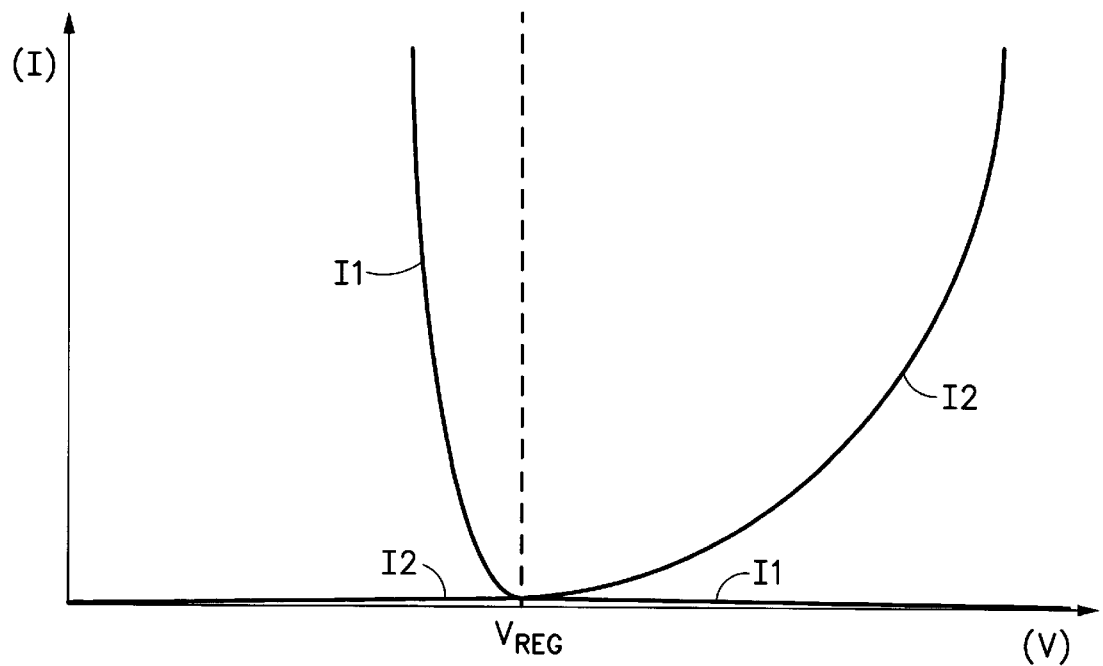
FIG. 7 illustrates a graph of the voltage-current characteristic of portions of the output buffer of FIG. 4 affected by the clamp circuits of FIGS. 5 and 6, which is useful in understanding the present invention.

FIG. 3 illustrates in schematic form partial-to-full level generator 33 of FIG. 1 in accordance with the present invention. Generator 33 includes P-channel MOS transistors 71 and 72, N-channel MOS transistors 73, 74, and 75, NPN transistor 76, resistor 77, N-channel transistors 78 and 79, resistors 80 and 81, an N-channel transistor 82, P-channel transistors 83 and 84, and N-channel transistors 85 and 86. Transistor 71 has a source connected to $V_{DD}$, a gate for receiving signal PED, and a drain. Transistor 72 has a source connected to $V_{DD}$, a gate for receiving signal $\overline{PED}$, and a drain. Transistor 73 has a drain connected to the drain of transistor 71, a gate connected to the drain of transistor 73, and a source connected to $V_{SS}$. Transistor 74 has a drain connected to the drain of transistor 72, a gate connected to the drain of transistor 73, and a source connected to $V_{SS}$. Transistor 75 has a drain connected to the drain of transistor 74, a gate for receiving signal $\overline{OE}$, and a source connected to $V_{SS}$. Transistor 76 has a collector connected to $V_{DD}$, a base, and an emitter. Resistor 76 has a first terminal connected to the emitter of transistor 76, and a second terminal for providing signal $\overline{DATA}$. Transistor 78 has a drain connected to the second terminal of resistor 77, a gate connected to the drain of transistor 74, and a source. Transistor 79 has a drain connected to the second terminal of resistor 77, a gate for receiving signal $\overline{OE}$, and a source. Resistor 80 has a first terminal connected to the source of transistor 78, and a second terminal connected to $V_{SS}$. Resistor 81 has a first terminal connected to the source of transistor 79, and a second terminal connected to $V_{SS}$. Transistor 82 has a drain connected to the base of transistor 76, a gate for receiving signal $\overline{OE}$, and a source connected to $V_{SS}$. Transistor 83 has a source connected to $V_{DD}$, a gate for receiving signal PED, and a drain connected to the base of transistor 76 and providing signal $\overline{QD}$ thereon. Transistor 84 has a source connected to $V_{DD}$, a gate for receiving signal $\overline{PED}$, and a drain. Transistor 85 has a drain connected to the drain of transistor 83, a gate connected to the drain of transistor 84, and a source connected to $V_{SS}$. Transistor 86 has a drain connected to the drain of transistor 84, a gate connected to the drain of transistor 84, and a source connected to $V_{SS}$.

When signal $\overline{OE}$ is inactive at a logic high, then generator 33 is disabled. The gate of transistor 78, the base of transistor 76, and the second terminal of resistor 77 (signal $\overline{DATA}$) are driven to approximately $V_{SS}$ by transistors 75, 79, and 82, respectively. Note that resistor 81 controls the rate at which signal $\overline{DATA}$ falls to $V_{SS}$, which helps control di/dt when $\overline{OE}$ becomes inactive.

When signal $\overline{OE}$ is active at a logic low, transistors 75, 79, and 82 are all nonconductive. Generator 33 provides signals $\overline{DATA}$ and $\overline{QD}$ in response to a logic state represented by signals PED and $\overline{PED}$. Transistors 71–74 form a CMOS amplifier which provides a CMOS logic high (approximately $V_{DD}$) at the drain of transistor 72 if signal PED is active at a logic high and signal $\overline{PED}$ is active at a logic low, and provides a CMOS logic low (approximately $V_{SS}$) if signal PED is inactive at a logic low and signal signal $\overline{PED}$ is inactive at a logic high. Conversely, transistors 83–86 form a CMOS amplifier providing a CMOS logic high (low) in response to signal PED being active (inactive) and signal $\overline{PED}$ being active (inactive) at their respective logic levels. The drain of transistor 83 provides CMOS-level signal $\overline{QD}$ which is also provided to the base of transistor 76. Output signal $\overline{DATA}$ is provided at a logic high of approximately $(V_{DD}-V_{BE})$, and a logic low of approximately $V_{SS}$. Thus, the logic high voltage of $\overline{DATA}$ is level-shifted downward by one $V_{BE}$ from a full CMOS logic high. Resistors 77 and 80 are also important in controlling di/dt when signal Q switches. When signal $\overline{QD}$ becomes inactive at a logic high, resistor 77 controls the rate at which signal $\overline{DATA}$ rises; when the voltage at the drain of transistor 72 is driven to a logic high, then resistor 80 controls the rate at which signal $\overline{DATA}$ falls. In a preferred embodiment, the values of resistors 80 and 81 are different to provide different signal speeds and di/dt depending on whether Q is driven out in response to a change in the data or in response to OE becoming active.

Figure 4:
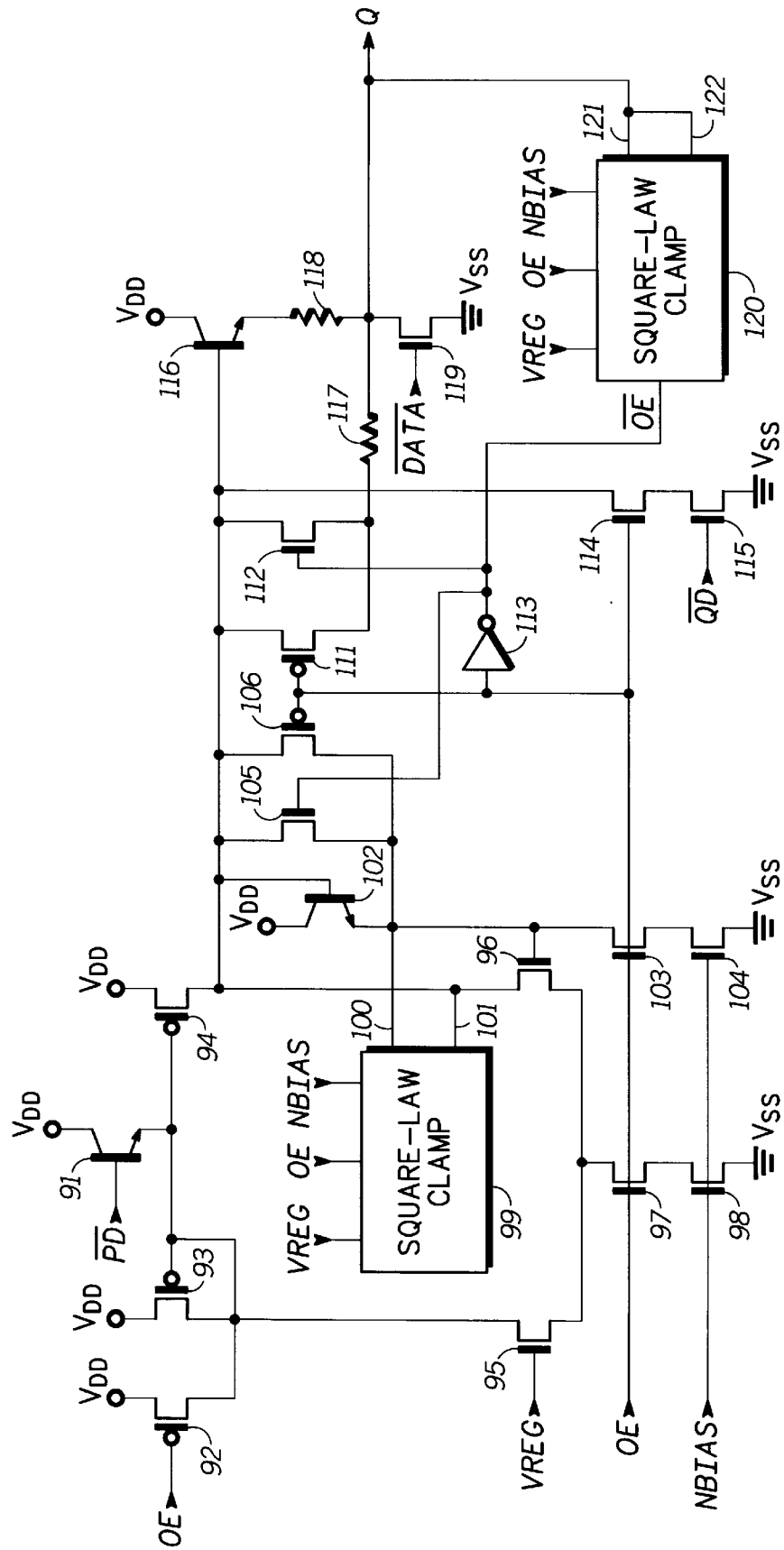
FIG. 4 illustrates in schematic form the output buffer circuit of FIG. 1 in accordance with the present invention.
Figure 5:
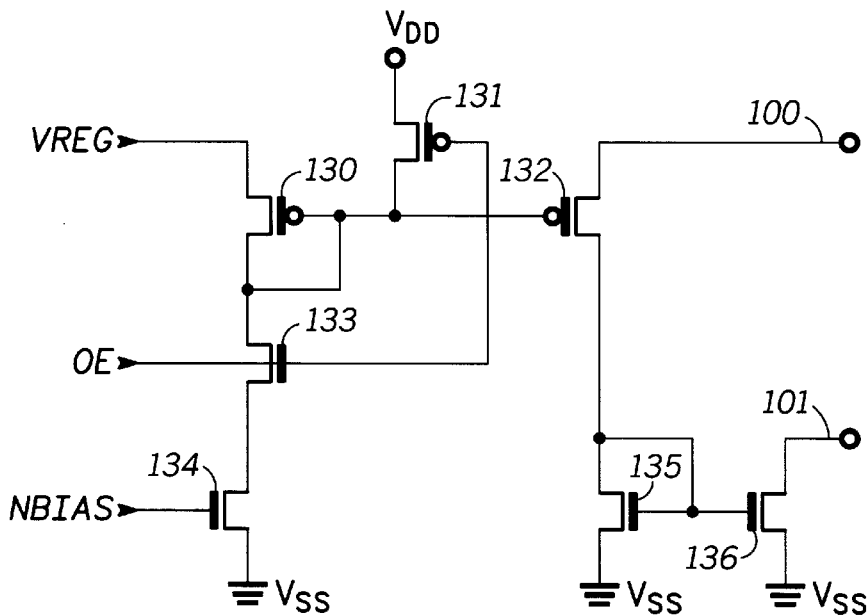
FIG. 5 illustrates in schematic form one of the clamp circuits of FIG. 4 in accordance with the present invention.

FIG. 4 illustrates in schematic form output buffer circuit 34 of FIG. 1 in accordance with the present invention. Output buffer 34 includes an NPN transistor 91, P-channel MOS transistors 92–94, N-channel MOS transistors 95–98, a square-law clamp 99, an NPN transistor 102, N-channel transistors 103, 104, and 105, P-channel transistors 106 and 111, an N-channel transistor 112, an inverter 113, N-channel MOS transistors 114 and 115, an NPN transistor 116, resistors 117 and 118, an N-channel MOS transistor 119, and a square-law clamp 120. Transistor 91 has a collector connected to $V_{DD}$, a base for receiving signal $\overline{PD}$, and an emitter. Transistor 92 has a source connected to $V_{DD}$, a gate for receiving signal OE, and a drain. Transistor 93 has a source connected to $V_{DD}$, a gate connected to the emitter of transistor 91 and a drain connected to the gate of transistor 93 and to the drain of transistor 92. Transistor 94 has a source connected to $V_{DD}$, a gate connected to the drain of transistor 93, and a drain. Transistor 95 has a drain connected to the drain of transistor 93, a gate for receiving a reference voltage labelled "VREG", and a source. Transistor 96 has a drain connected to the drain of transistor 94, a gate, and a source connected to the source of transistor 95. Transistor 97 has a drain connected to the source of transistors 95 and 96, a gate for receiving signal OE, and a source. Transistor 98 has a drain connected to the source of transistor 97, a gate for receiving signal NBIAS, and a source connected to $V_{SS}$. Square-law clamp 99 receives as inputs signals VREG, OE, and NBIAS, and has an input/output terminal 100, and an output terminal 101 connected to the drain of transistor 94. Transistor 102 has a collector connected to $V_{DD}$, a base connected to the drain of transistor 94, and an emitter connected to the input/output terminal of square-law clamp 99 and to the gate of transistor 96. Transistor 103 has a drain connected to the emitter of transistor 102, a gate for receiving signal OE, and a source. Transistor 104 has a drain connected to the source of transistor 103, a gate for receiving signal NBIAS, and a source connected to $V_{SS}$. Transistor 104 has a drain connected to the drain of transistor 94, a gate for receiving signal $\overline{OE}$, and a source connected to the emitter of transistor 102. Transistor 105 has a source connected to the drain of transistor 94, a gate for receiving signal OE, and a drain connected to the emitter of transistor 102.

Transistor 111 has a source connected to the drain of transistor 94, a gate for receiving signal OE, and a drain. Transistor 112 has a drain connected to the drain of transistor 94, a gate for receiving signal $\overline{OE}$, and a source connected to the drain of transistor 111. Inverter 113 has an input terminal for receiving signal OE, and an output terminal for providing signal $\overline{OE}$. Transistor 114 has a drain connected to the drain of transistor 94, a gate for receiving signal OE, and a source. Transistor 115 has a drain connected to the source of transistor 114, a gate for receiving signal $\overline{QD}$, and a source connected to $V_{SS}$. Transistor 116 has a collector connected to $V_{DD}$, a base connected to the drain of transistor 94, to the source of transistor 111, and to the drain of transistor 112, and an emitter. Resistor 117 has a first terminal connected to the drain of transistor 111 and to the source of transistor 112, and a second terminal. Resistor 118 has a first terminal connected to the emitter of transistor 116, and a second terminal connected to the second terminal of resistor 117 and providing signal Q. Transistor 119 has a drain connected to the second terminal of resistor 118, a gate for receiving signal $\overline{DATA}$, and a source connected to $V_{SS}$. Square-law clamp 120 receives as inputs signals VREG, OE, NBIAS, and $\overline{OE}$, and has an input/output terminal 120 connected to the second terminal of resistor 118, and an output terminal 122 connected to input/output terminal 121.

Output buffer 34 provides output signal Q to bonding pad 35 at a logic low voltage of approximately $V_{SS}$, and a logic high voltage of approximately VREG. Thus, the value of VREG may be chosen to provide an optimum tradeoff between speed and di/dt for the types of loads which may be encountered. It is especially advantageous to have a regulated logic high voltage when the integrated circuit of portion 30 has a 5-volt power supply, and another integrated circuit connected to bonding pad 35 has a 3-volt power supply.

When OE is inactive, transistors 92, 111, and 112 are conductive, and transistors 97, 103, and 114 are nonconductive. Transistor 92 provides a logic high voltage on the gates of transistors 93 and 94, causing both to be nonconductive. Also transistors 97 and 103 are nonconductive, preventing transistors 98 and 104 from functioning as current sources. Transistors 111 and 112 are conductive, coupling the base and emitter of transistor 116 together, and preventing a reverse bias from forming across the base-emitter junction, which would create reliability problems. Also, square-law clamps 99 and 120 are made nonconductive.

Transistors 105 and 106 perform two functions when signal OE is inactive. First, when signal OE is inactive, an undesirable leakage path to output signal Q may exist. When signal OE is inactive, output buffer 34 should be in a high impedance state. Transistor 92 is conductive, coupling the drain of transistor 93 to $V_{DD}$. The leakage path may develop from the drain of transistor 92 through transistors 95 and 96 to the base of transistor 116, affecting signal Q if provided at a logic low by an external device. Since the emitter of transistor 102 is floating when signal OE is inactive, the gate of transistor 96 may remain at a logic high, keeping transistor 96 conductive and completing the leakage path. However transistors 105 and 106, which are conductive when signal OE is inactive, provide a discharge path for the gate of transistor 96. Second, transistors 105 and 106 prevent a large reverse bias from developing on transistor 102. The base of transistor 102 is coupled to the base of transistor 116, and follows the voltage at the emitter of transistor 116, which may be driven to a logic low. However the emitter of transistor 102 is floating and may remain high. Transistors 105 and 106 solve this problem by coupling the base and emitter together when signal OE is inactive.

When signal OE is active at a logic high (signal $\overline{OE}$ active at a logic low), then output buffer 34 provides signal Q in response to a logic state represented collectively by signals $\overline{PD}$, $\overline{QD}$, and $\overline{DATA}$. When signal Q is to be driven at a logic high, signals $\overline{PD}$, $\overline{QD}$, and $\overline{DATA}$ are all active at a logic low. Transistors 91–98 form a difference amplifier, which tries to change the voltage at the drain of transistor 94 until the voltage at one input (the gate of transistor 96) equals the voltage at the other input (VREG). The voltage at the gate of transistor 96 will equal VREG only when the voltage at the base of transistor 102 is one $V_{BE}$ higher, or ($V_{REG}+V_{BE}$). Transistor 102 and output transistor 116 are matched so that their $V_{BE}$s are equal. Thus (neglecting the effect of resistor 118), output buffer 34 regulates the logic high voltage of Q to be approximately VREG. Resistor 118 is provided in series with the emitter of transistor 116 to control the di/dt when output buffer 34 provides signal Q at a logic high; however, once signal Q reaches approximately VREG, then the steady-state current through resistor 118 is very small and resistor 118 does not cause any appreciable voltage drop.

When signal Q is to be driven at a logic low, signals $\overline{PD}$, $\overline{QD}$, and $\overline{DATA}$ are all at a logic high. Since the logic high voltage of $\overline{PD}$ is approximately $V_{DD}$, then the voltage at the emitter of transistor 91 is approximately equal to ($V_{DD}-V_{BE}$). This voltage is above $V_{DD}$ minus the threshold voltage of transistors 93 and 94, and thus transistors 93 and 94 are both nonconductive. However, transistor 91, using partial-level signal $\overline{PD}$, keeps the gates of transistors 93 and 94 close to their thresholds when signal OE is active. Transistors 114 and 115 are conductive, decreasing the voltage at the base of transistor 116 to approximately $V_{SS}$. $\overline{DATA}$ is also a logic high, making transistor 119 conductive and coupling signal Q substantially to $V_{SS}$. Here, a difference in levels between signals $\overline{QD}$ and $\overline{DATA}$ becomes important to the operation of output buffer 34. Signal $\overline{QD}$ is provided at a full-CMOS logic high of approximately $V_{DD}$, in order to reduce the voltage at the base of transistor 116 as quickly as possible. However, signal $\overline{DATA}$ has a logic high voltage of only approximately ($V_{DD}$-$V_{BE}$), which limits the conductivity of transistor 119. Furthermore, resistor 77 of generator 33 slows the rate at which $\overline{DATA}$ reaches its logic high voltage, decreasing the di/dt caused by output buffer 34 when signal Q is to be provided at a logic low. A difference in timing is also important to the operation of output buffer 34. Signal $\overline{QD}$ precedes signal $\overline{DATA}$ in time, helping to avoid crowbar current which would otherwise flow if transistors 116 and 119 were both simultaneously conductive.

Square-law clamps 99 and 120 provide clamping to keep the voltage on signal Q from rising above VREG, such as may occur on a transmission line because of signal reflection. First, clamp 120 clamps the output signal Q directly. Second, clamp 99 clamps the voltage at the base of transistor 116 if the voltage at the emitter of transistor 102 (mirroring transistor 116) exceeds VREG. Both clamps 99 and 120 provide a "soft" clamp by damping the appropriate signal lines according to a square-law characteristic, proportional to the difference between the voltage of interest and VREG. The precise operation of clamps 99 and 120 will become dearer with regard to the discussion of FIGS. 5a and 5b, below.

Output buffer 34 (in conjunction with generators 32 and 33) solve each of the previously-mentioned problems. First, they provide di/dt control for any possible signal transition. In some integrated circuit applications, such as memories, the output signal Q may be timed either from the transition of the data (where control signal OE is already active), or from the transition of control signal OE (where the correct data is already available). TABLE I illustrates the ways in which portion 30 controls the di/dt when signal Q switches:

TABLE I

| Q Signal Transition | Triggering Event | Source of di/dt Control |
|---|---|---|
| leading edge of 1 (116 conductive) | MUX/$\overline{MUX}$ changing | ramp rate of voltage at base of transistor 116 |
| trailing edge of 1 (116 nonconductive) | MUX/$\overline{MUX}$ changing | current limit of transistor 98 |
| leading edge of 0 (119 conductive) | MUX/$\overline{MUX}$ changing | value of resistor 77, logic high voltage of $\overline{DATA}$ |
| trailing edge of 0 (119 nonconductive) | MUX/$\overline{MUX}$ changing | value of resistor 80 |
| leading edge of 1 | OE changing | ramp rate of voltage at base of transistor 116 and partial level driven by transistor 91 |
| trailing edge of 1 | OE changing | current limit of transistor 98 |
| leading edge of 0 | OE changing | value of resistor 77 |
| trailing edge of 0 | OE changing | value of resistor 81 |

An important feature of generator 33 is that the values of resistors 77 and 81 may be made different in order to optimize the tradeoff between speed and di/dt control on the trailing edge of 0 between different triggering events.

However, output buffer 34 provides di/dt control along with improved speed. When signal Q is to be provided at a logic high, signal $\overline{PD}$ is active. Since $\overline{PD}$ is a partial level signal, it is available from generator 32 before full-level signals $\overline{QD}$ and $\overline{DATA}$ are available from generator 33.

Thus, when signal Q is to be provided at a logic high, transistor 91 quickly activates the CMOS differential amplifier. However, the voltage at the emitter of transistor 91 is equal to ($\overline{PD}$-$V_{BE}$), which is high enough to keep transistors 93 and 94 from conducting.

Second, output buffer 34 prevents a large reverse bias from developing across the base-emitter junctions of bipolar transistors. In response to OE being inactive, transistors 111 and 112 are conductive, connecting the base and emitter of transistor 116 together through resistors 117 and 118. Thus, when bonding pad 35 is at a logic high when output buffer 34 is inactive and the voltage at the base of transistor 116 is at a logic low, transistors 111 and 112 prevent a large base-to-emitter reverse bias from forming.

Third, clamps 99 and 120 prevent the self boosting of the base of transistor 116 when switching a large capacitive load (not shown in FIG. 4). If the voltage on the base of transistor 116 exceeds (VREG+$V_{BE}$), then clamp 99 starts to sink current into output terminal 101. Similarly, when the voltage at the second terminal of resistor 118 exceeds VREG (which occurs when the emitter of transistor 116 follows the self-boosting base), clamp 120 starts to sink current into both input/output terminal 121 and output terminal 122. Since clamps 99 and 120 are square-law clamps, when the voltage at the respective node of interest exceeds VREG, the action of the clamp is determined by a square-law characteristic where the current (I) drawn into the clamp is proportional to the square of the difference between the voltage (V) and VREG. Thus, for small differences in voltage, square-law clamps 99 and 120 provide only small currents. The square-law characteristic is important in preventing overdamping in systems which can be modeled as transmission lines. Clamp 99 directly clamps the voltage at the base of transistor 116 to prevent self boosting.

Fourth, output buffer circuit 34 is able to interface with a variety of load types, including a 3.3-volt integrated circuit coupled to bonding pad 35 in a way which can be modeled as a transmission line. The use of a regulated voltage allows a 5-volt integrated circuit such as the one which includes portion 30 to be interfaced to a three-volt integrated circuit, for example. This result is achieved without affecting the reference voltage VREG itself. In the illustrated embodiment, VREG is provided by an on-chip bandgap voltage generator; however in other embodiments, VREG may be provided externally. Furthermore, the regulation of the voltage of signal Q is achieved without being influenced by any signal reflected on bonding pad 35. Since some load types may be modeled as transmission lines, the possibility of an underdamped signal excitation system exists. Since signal Q is measured as the voltage at the emitter of transistor 102 (and not at the emitter of transistor 116), signal reflection on bonding pad 35 which causes signal Q to increase above VREG does not cause output buffer 34 to adjust. The comparison is performed between VREG and the voltage at the emitter of transistor 102, which follows the voltage at the base of transistor 116 but without being influenced by any reflected signal.

FIG. 5a illustrates in schematic form clamping circuit 99 of FIG. 4 in accordance with the present invention. Clamping circuit 99 includes P-channel MOS transistors 130–132, and N-channel MOS transistors 133–136. Transistor 130 has a source for receiving signal VREG, a gate, and a drain connected to the date of transistor 130. Transistor 131 has a source connected to $V_{DD}$, a gate for receiving signal OE, and a drain connected to the gate of transistor 130. Transistor 132 has a source connected to input/output terminal 101, a gate connected to the drain of transistor 130, and a drain.

Transistor 133 has a drain connected to the drain of transistor 130, a gate for receiving signal OE, and a source. Transistor 134 has a drain connected to the source of transistor 133, a gate for receiving signal NBIAS, and a source connected to $V_{SS}$. Transistor 135 has a drain connected to the drain of transistor 132, a gate connected to the drain of transistor 135, and a source connected to $V_{SS}$. Transistor 136 has a source connected to output terminal 102, a gate connected to the drain of transistor 132, and a source connected to $V_{SS}$.

When OE is inactive at a logic low, transistor 133 is nonconductive and no current flows. Transistor 131 is conductive, and the gates of transistors are coupled to $V_{DD}$, preventing transistors 130 and 132 from becoming conductive regardless of the voltage at input/output terminal 100. When OE is active at a logic high, square-law clamp 99 is enabled. The voltage at the gate of transistor 130 (connected to the drain thereof) falls until it biases transistor 130 to conduct the current supplied by transistor 134 when biased by NBIAS. This voltage, equal to approximately (VREG-$V_{TP}$), where $V_{TP}$ is the threshold of transistor 130, is also applied to the gate of transistor 132. If an input voltage coupled to input/output terminal 100 is less than VREG, then transistor 132 is substantially nonconductive. However, as the voltage at terminal 100 rises above VREG, the current conducted by transistor 132 increases with the square of the difference. Thus, a current flowing into terminal 100 is proportional to the square of the difference between the voltage thereon and VREG. Transistors 135 and 136 form a current mirror which mirrors the current conducted by transistor 132 to be provided into output terminal 101.

Square-law clamp 99 provides at least three advantages over known clamping circuits. First, clamp 99 provides a clamp to an arbitrary reference voltage VREG, as long as the reference voltage exceeds the sum of an N-channel threshold and a P-channel threshold. Second, transistor 136 allows the strength of clamp 99 to be adjusted for particular applications. Third, square-law clamp 99 imposes very little propagation delay in a regulation loop because the terminal which determines the amount of current, input/output terminal 100, is the same terminal into which the resultant current flows. A current response into output terminal 101 is delayed only by the delay of the current mirror formed by transistors 135 and 136, which is very small. This is an important improvement, because delay in the feedback path is a classically recognized cause of oscillation in clamping circuits and regulators in general.

FIG. 5b illustrates in schematic form clamping circuit 120 of FIG. 4 in accordance with the present invention. Clamping circuit 120 is structurally similar to clamping circuit 99 and thus corresponding elements have been assigned the same reference numbers. There are two differences between clamping circuit 120 and clamping circuit 99. First, clamping circuit 120 includes an N-channel transistor 141 having a drain connected to the gate of transistor 136, a gate for receiving signal $\overline{OE}$, and a source connected to $V_{SS}$. Transistor 141 allows the gates of current-mirror transistors 135 and 136 to be coupled to $V_{SS}$ when $\overline{OE}$ is inactive. Second, output terminal 122 is connected to input/output terminal 121. Thus, current conducted into the current mirror formed by transistors 135 and 136 is added to the current conducted by transistor 132, and the strength of clamp 120 is increased. The connection of output terminal 122 to input/output terminal 121 is an additional way to increase the strength of the square-law clamp.

Figure 6:
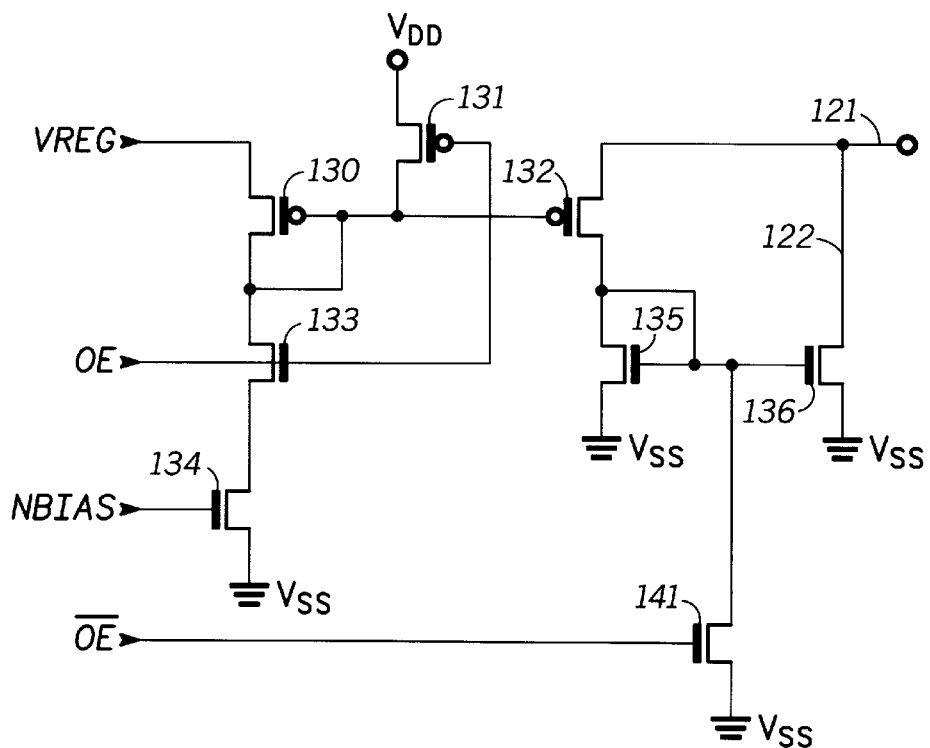
FIG. 6 illustrates in schematic form the other clamp circuit of FIG. 4 in accordance with the present invention.

FIG. 6 illustrates a graph of the voltage-current characteristic of portions of output buffer 34 affected by square-law clamps 99 and 120, which is useful in understanding the present invention. In FIG. 6, the vertical axis represents current (I), and the horizontal axis represents the voltage (V). Above $V_{REG}$, the square-law clamp begins operating. In the context of square-law clamp 101, when (V<$V_{REG}$), a current labelled "$I_1$" located along a current-voltage curve which has an exponential characteristic is conducted through the base-emitter diode of transistor 102, and $I_1$ '$e^{(V_{REG}-V)}$'. However, as the voltage approaches $V_{REG}$, the base-emitter diode voltage drops below its cutin voltage, and eventually $I_1$ reaches approximately zero (neglecting reverse saturation current). When (V=$V_{REG}$), however, the source voltage of transistor 132 of clamp 99 increases to a level which causes the gate-to-source voltage of transistor 132 to equal its threshold voltage. For voltages above $V_{REG}$, another current labelled "I2" located along a current-voltage curve which has a square-law characteristic is conducted through clamp 99, and $I_2$ '(V-$V_{REG}$)$^2$. Furthermore, clamp 99 mirrors the current of transistor 135 into transistor 136, and thus when the voltage at the emitter of transistor 102 exceeds $V_{REG}$, node 101 displays the same square-law voltage current characteristic.

In the context of square-law clamp 120, for voltages at the second terminal of resistor 118 (Q) less than $V_{REG}$, the current conducted into the load (not shown in FIG. 4) demonstrates an exponential characteristic which decreases as the base-emitter diode of transistor 116 approaches its cutin voltage. Above $V_{REG}$, the gate-to-source voltage of transistor 132 exceeds its threshold, and I is conducted according to a square-law characteristic proportional to (V-$V_{REG}$)$^2$. Note however, that output terminal 122 of clamp 120 is connected to input/output terminal 121, and hence the mirrored current conducted through transistor 136 is added to the total current; thus, the current is doubled. Such a mirroring technique can be used, along with the sizing of transistors 132 and 136, to fine-tune an I/V characteristic to the particular range of possible load types for optimum performance.

Use of square-law clamps 99 and 120 by output buffer 34 provides a hard drive up to the desired voltage ($V_{REG}$), and a soft clamping for voltages above $V_{REG}$. This characteristic solves at least three important problems with output buffer 34. First, clamps 99 and 120 prevent the self-boosting of the base of transistor 116, which is especially troublesome when a largely-capacitive load is connected to the second terminal of resistor 118. Second, square-law clamp 120 prevents oscillation when the transmission-line characteristics of the load cause the output buffer/load system to demonstrate an underdamped switching characteristic. Thus, output buffer 34 is able to operate with a wider variety of load types than known conventional output buffers. Third, clamps 99 and 120 help control crowbar current. The highest crowbar current occurs when the exponential curve intersects the square-law curve. With slight manufacturing variations, in which the curves move to the left or right with respect to each other in FIG. 6, the crowbar point still remains low since one curve is non-exponential. If both curves were exponential, then crowbar current could be very large if manufacturing variations force the curves together. Furthermore, ordinary regulators provide a linear response by using a passive, resistive load, which doesn't provide as low a nominal current as clamps 99 and 120 do.

While the invention has been described in the context of a preferred embodiment, it will be apparent to those skilled in the art that the present invention may be modified in numerous ways and may assume many embodiments other than that specifically set out and described above. For example, the conductivity types of the transistors in square-law clamps 99 or 122 may be reversed to provide analogous clamps. Also, transistor 136 and output terminal 101 of square-law clamp 99 of FIG. 5a may be omitted in other embodiments. Accordingly, it is intended by the appended claims to cover all modifications of the invention which fall within the true spirit and scope of the invention.

We claim:

1. A square-law clamping circuit comprising:
   a first MOS transistor having a source for receiving a reference voltage, a gate, and a drain coupled to said gate of said first MOS transistor;
   a current source having a first terminal coupled to said drain of said first MOS transistor, and a second terminal coupled to a power supply voltage terminal, for conducting a predetermined current therethrough;
   a second MOS transistor having a source providing an input/output terminal, a gate coupled to said drain of said first MOS transistor, and a drain;
   a third transistor having a first current electrode coupled to said drain of said second MOS transistor, a control electrode coupled to said first current electrode of said third transistor, and a second current electrode coupled to said power supply voltage terminal; and
   a fourth transistor having a first current electrode for providing an output terminal of the square-law clamping circuit, a control electrode coupled to said first current electrode of said third transistor, and a second current electrode coupled to said power supply voltage terminal.

2. The square-law clamping circuit of claim 1 further comprising a fifth transistor having a first current electrode coupled to said drain of said first MOS transistor, a control electrode for receiving a control signal, and a second current electrode coupled to said first terminal of said current source.

3. The square-law clamping circuit of claim 2 further comprising a sixth transistor having a first current electrode coupled to a second power supply voltage terminal, a control electrode for receiving said control signal, and a second current electrode coupled to said gates of said first and second MOS transistors.

4. The square-law clamping circuit of claim 1 wherein said current source comprises a fifth transistor having a first current electrode for providing a first terminal of said current source, a control electrode for receiving a bias voltage, and a second current electrode coupled to said power supply voltage terminal.

5. The square-law clamping circuit of claim 3 wherein said output terminal is coupled to said input/output terminal.

6. The square-law clamping circuit of claim 5 further comprising a seventh transistor having a first current electrode coupled to said control electrodes of said third and fourth transistors, a control electrode for receiving a second control signal, and a second current electrode coupled to said power supply voltage terminal.

7. The square-law clamping circuit of claim 6 wherein said second control signal is a complement of said control signal.

* * * * *